United States Patent
Song et al.

(10) Patent No.: US 6,577,554 B2
(45) Date of Patent: Jun. 10, 2003

(54) SEMICONDUCTOR MEMORY DEVICE FOR PROVIDING MARGIN OF DATA SETUP TIME AND DATA HOLD TIME OF DATA TERMINAL

(75) Inventors: Ho-sung Song, Seoul (KR); Mi-seon Kang, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 109 days.

(21) Appl. No.: 09/922,247

(22) Filed: Aug. 6, 2001

(65) Prior Publication Data

US 2002/0021586 A1 Feb. 21, 2002

(30) Foreign Application Priority Data

Aug. 8, 2000 (KR) ........................................ 2000-45891

(51) Int. Cl.[7] .................................................. G11C 8/00
(52) U.S. Cl. .............. 365/233; 365/189.02; 365/230.02
(58) Field of Search ........................ 365/189.02, 189.08, 365/191, 207, 233, 230.02, 230.08, 189.07

(56) References Cited

U.S. PATENT DOCUMENTS 6,366,155 B1 * 4/2002 Moon et al. ................ 327/530
6,373,303 B2 * 4/2002 Akita ......................... 327/156

* cited by examiner

Primary Examiner—Richard Elms
Assistant Examiner—Hien Nguyen
(74) Attorney, Agent, or Firm—Volentine Francos, PLLC

(57) ABSTRACT

A semiconductor memory device secures a margin of data setup time and hold time of a data terminal and includes a delay locked loop, an output replica, an output driver, and an output multiplexer. The delay locked loop compares phases of external and feedback clock signals, and generates internal and delayed internal clock signals. The output replica receives memory cell data, generates the feedback control signal and controls load of a line of the feedback control signal to generate the feedback clock signal, responsive to current control signals for controlling current of the data terminal. The output multiplexer delays the memory cell data by a predetermined time in synchronization with the internal clock signal and responsive to the current control signals. The output driver is driven by the current control signals and the delayed memory cell data, and determines voltage level of the data terminal.

17 Claims, 10 Drawing Sheets

SEMICONDUCTOR MEMORY DEVICE FOR PROVIDING MARGIN OF DATA SETUP TIME AND DATA HOLD TIME OF DATA TERMINAL

The present application claims priority under 35 U.S.C. §119 to Korean Application No. 2000-45891 filed on Aug. 8, 2000, which is hereby incorporated by reference in its entirety for all purposes.

BACKGROUND OF THE INVENTION

1. Field of the Invention

The present invention relates to a semiconductor memory device, and more particularly, to a semiconductor memory device for providing a margin of data setup time and data hold time of a data terminal DQ.

2. Description of the Related Art

Most recently, as high integration technology of semiconductor memory devices progresses, high-speed and high performance semiconductor memory devices can be provided. Synchronous dynamic random access memories (SDRAMs) typically run at operating frequencies ranging from 100–200 MHz and are synchronized with a clock signal to input data to a memory cell, or output memory cell data to a valid data window. In a computer system or an electric system running at higher speeds, a dual data rate DRAM (DDR DRAM) or a Rambus DRAM (RDRAM) support operating frequencies of about 500 MHz-1.6 GHz. In particular, in the case of RDRAM implementing a high speed operation having data transfer speeds of 800 Mbps, it is important to output data in synchronization with an external clock signal.

FIG. 1 shows a portion of a conventional RDRAM including blocks which synchronize data output with an external clock signal. Referring to FIG. 1, a RDRAM 100 includes a delay locked loop (DLL) 110, an output replica 120, a current controller 130, an output multiplexer 140, and an output driver 150. The DLL 110 has input thereto an external clock signal EXTCLK and a feedback clock signal TCLKFB, and generates an internal clock signal TCLK and an internal delay clock signal TCLK90 having phase delayed by 90 degrees with respect to the internal clock signal TCLK. The internal clock signal TCLK is used as a reference signal during operation of internal circuit blocks of the RDRAM 100.

The output replica 120 replicates the internal delay clock signal TCLK90 to generate a feedback clock signal TCLKFB. The DLL 110 compares a phase of the feedback clock signal TCLKFB with a phase of the external clock signal EXTCLK to generate the internal clock signal TCLK synchronized with the external clock signal EXTCLK. The output multiplexer 140, which is one of internal circuit blocks in the RDRAM 100, selects memory cell data in synchronization with the internal clock signal TCLK and transmits the selected memory cell data to the output driver 150.

Referring to FIG. 2, the output multiplexer 140 receives the internal clock signal TCLK and separates internal clock signal TCLK to provide a clock signal CLK via inverters 12 and 14, and to provide an inverted clock signal CLKB via inverters 16, 18, and 20. A transmission gate 22 transmits memory cell data to the output driver (150 of FIG. 1) via inverters 24, 26 and 28, in response to the clock signal CLK and the inverted clock signal CLKB.

Turning to FIG. 1, the current controller 130 supplies stable current to a bus line driven by a current mode output driver, and generates current control signals ICTRL<0:i> so as to make current changes due to variations in temperature, process, and power supply smaller. A representative current controller is disclosed in U. S. Pat. No. 5,254,883. The output driver 150 determines the voltage level of a data terminal DQ in response to the memory cell data selected by the output multiplexer and the current control signals ICTRL<0:i>. Furthermore, as the number of activated current control signals ICTRL<0:i> increases, the data transition time of the data terminal DQ becomes shorter.

Output data of the data terminal DQ in the RDRAM 100 is generally set to have a data setup time and a data hold time relative to an external clock signal EXTCLK. This is because the external clock signal EXTCLK works as a main clock signal for regulating the operation of the entire system (not shown), and the output data of the RDRAM 100 must therefore meet the data setup time and the data hold time specifications for the external clock signal EXTCLK. However, if the number of first NMOS transistors Ni in the output driver 150 which are selectively turned on by current control signals ICTRL<0:i> increases, output data of the data terminal DQ is transited at higher speeds. Thus, the data setup time and the data hold time set for the external clock signal EXTCLK are not satisfied. This causes malfunction of the entire system.

SUMMARY OF THE INVENTION

The present invention is therefore directed to providing a semiconductor memory device for securing a margin of data setup time and data hold time of a clock signal from a data terminal, which substantially overcomes one or more of the problems due to the limitations and disadvantages of the related art.

Accordingly, to achieve the above objectives and others, the present invention provides a semiconductor memory device including an output multiplexer that delays the memory cell data by a predetermined time in response to current control signals for regulating current of a data terminal and that outputs delayed memory cell data; and an output driver that is driven by current control signals and the memory cell data to determine a voltage level of the data terminal.

The present invention also provides a semiconductor memory device including: a delay locked loop that receives an external clock signal and a feedback clock signal, compares a phase of the external clock signal with a phase of the feedback clock signal, and generates an internal clock signal and an internal delay clock signal; an output replica that delays the internal delay clock signal by a predetermined phase to generate the feedback clock signal; an output multiplexer that delays the memory cell data by a time and that outputs the delayed memory cell data in synchronization with the internal clock signal and responsive to current control signals for regulating current of the data terminal; and an output driver that is driven by the current control signals and the delayed memory cell data, to determine voltage level of the data terminal.

The present invention also provides a semiconductor memory device including and an output multiplexer that controls phase of the internal clock signal responsive to current control signals for regulating current of the data terminal and that outputs the memory cell data based on the controlled internal clock signal; and an output driver that is driven by the current control signals and the memory cell data to determine voltage level of the data terminal.

The present invention also provides a semiconductor memory device including: a delay locked loop that receives the external clock signal and a feedback clock signal, compares a phase of an external clock signal with a phase of the feedback clock signal, and generates the internal clock signal and an internal delay clock signal; an output replica that generates the feedback clock signal and controls a load of a line of the feedback clock signal responsive to the current control signals and the memory cell data; an output multiplexer that outputs the memory cell data in synchronization with the internal clock signal; and an output driver that is driven by the current control signals and the memory cell data to determine voltage level of the data terminal.

The present invention also provides a semiconductor memory device including: a delay locked loop that receives an external clock signal and a feedback clock signal, compares a phase of the external clock signal with a phase of the feedback clock signal, and generates an internal clock signal and an internal delay clock signal; an output replica that generates the feedback clock signal and controls a load of a line of the clock signal, responsive to current control signals for controlling current of the data terminal and the memory cell data; an output multiplexer that delays the memory cell data by a time in synchronization with the internal clock signal; and an output driver that is driven by the current control signals and the delayed memory cell data to determine voltage level of the data terminal.

The semiconductor memory device according to the present invention is adapted to operate the output multiplexer and the output replica by current control signals, thereby securing the data setup time and data hold time.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
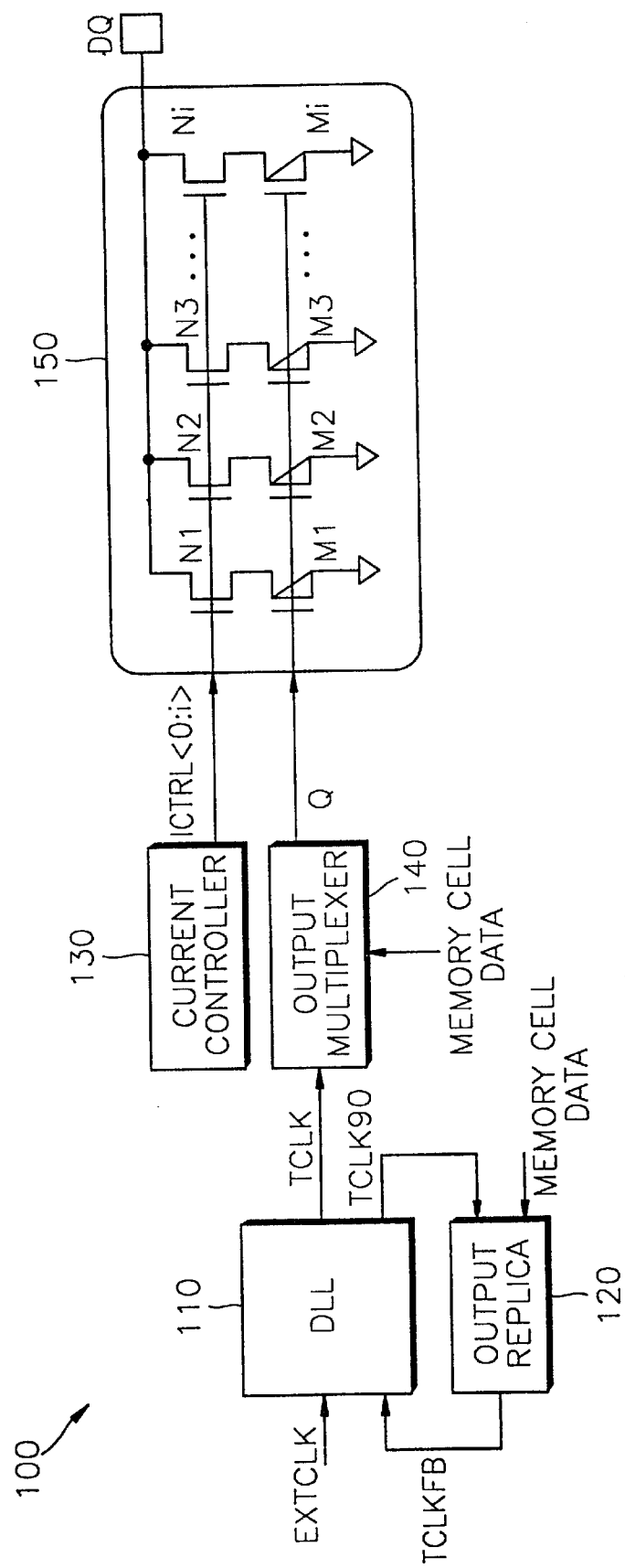
FIG. 1 shows a portion of a conventional Rambus DRAM (RDRAM) including blocks for synchronizing data output with an external clock signal.

The present invention will now be described more fully with reference to the accompanying drawings, in which preferred embodiments of the invention are shown. The same reference numerals appearing in different drawings represent the same element.

Figure 3:
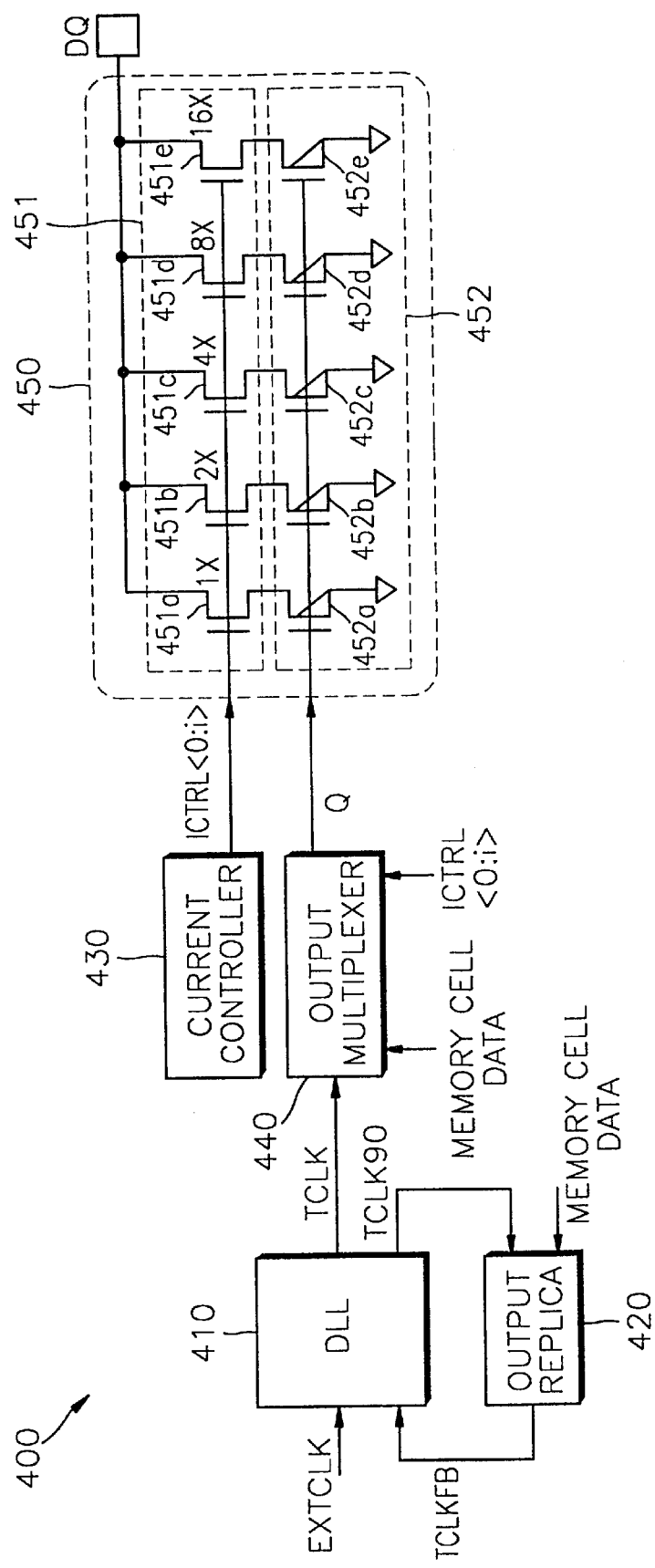
FIG. 3 shows a semiconductor memory device according to a first embodiment of the present invention.

Referring to FIG. 3, a semiconductor memory device 400 includes a delay locked loop 410 (DLL), an output replica 420, a current controller 430, an output multiplexer 440 and an output driver 450. The DLL 410 compares a phase of an external clock signal EXTCLK with a phase of a feedback clock signal TCLKFB, to generate an internal clock signal TCLK phase locked with the external clock signal EXTCLK and an internal delay clock signal TCLK90 having phase delayed by 90 degrees with respect to the internal clock signal TCLK. The internal delay clock signal TCLK90 is provided to the output replica 420, which in turn replicates the internal delay clock signal TCLK90 to generate a feedback clock signal TCLKFB. The output replica 420 delays the internal delay clock signal TCLK90 by a phase based on the memory cell data, and may be any typical circuit for providing phase delay as would be known by one of ordinary skill.

The current controller 430 generates current control signals ICTRL<0:i>, which are almost the same as the current control signals generated by the current controller (320 of FIG. 6) in U. S. Pat. No. 5,254,883, as noted above. The current control signals ICTRL<0:i> are selectively activated depending on temperature variations, process variations, and power supply variations.

Figure 4:
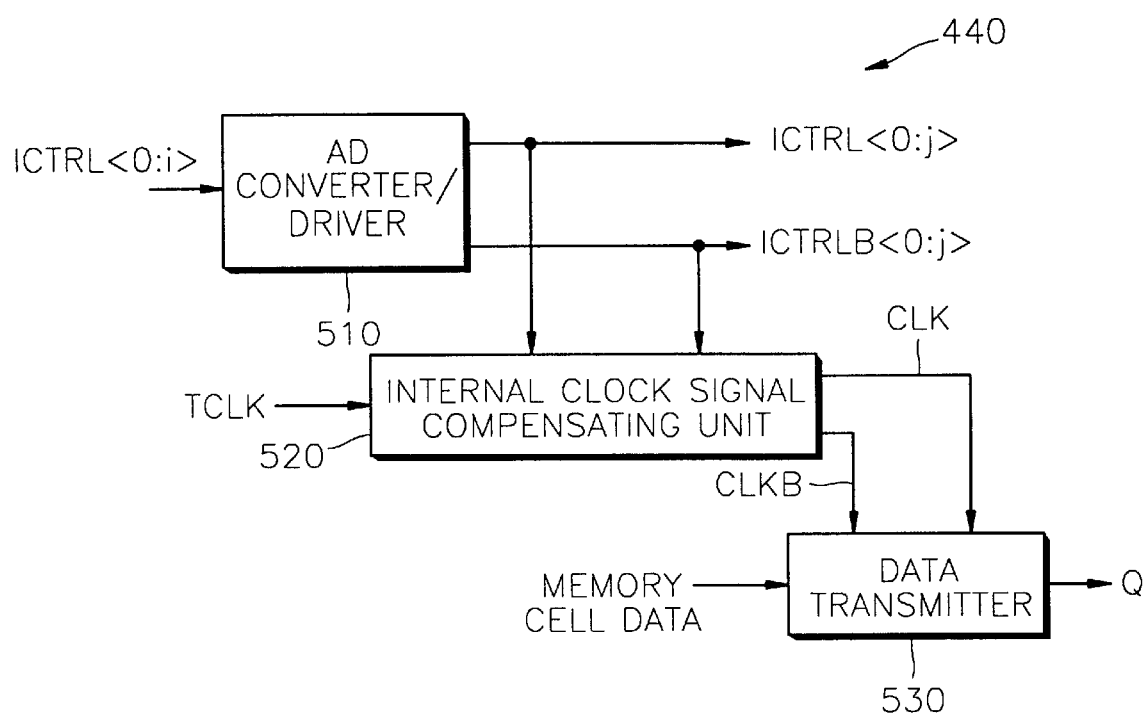
FIG. 4 shows the multiplexer of FIG. 3.

The output multiplexer 440 transmits memory cell data to the output driver 450 in response to the internal clock signal TCLK and the current control signals ICTRL<0:i>. As shown in FIG. 4, the output multiplexer 440 includes an analog-to-digital (AD) converter/driver 510, an internal clock signal compensating unit 520, and a data transmitter 530. The AD converter/driver 510 converts the current control signals ICTRL<0:i> into a predetermined digital format, for example, a pair of control clock signals ICTRL<0:j> and ICTRLB<0:j> represented by j bits. The internal clock signal compensating unit 520 delays internal clock signal TCLK by a predetermined time to generate a pair of complementary clock signals CLK and CLKB in response to the pair of control clock signals ICTRL<0:j> and ICTRLB<0:j>. The internal clock signal compensating unit 520 is shown in FIG. 5.

Figure 5:
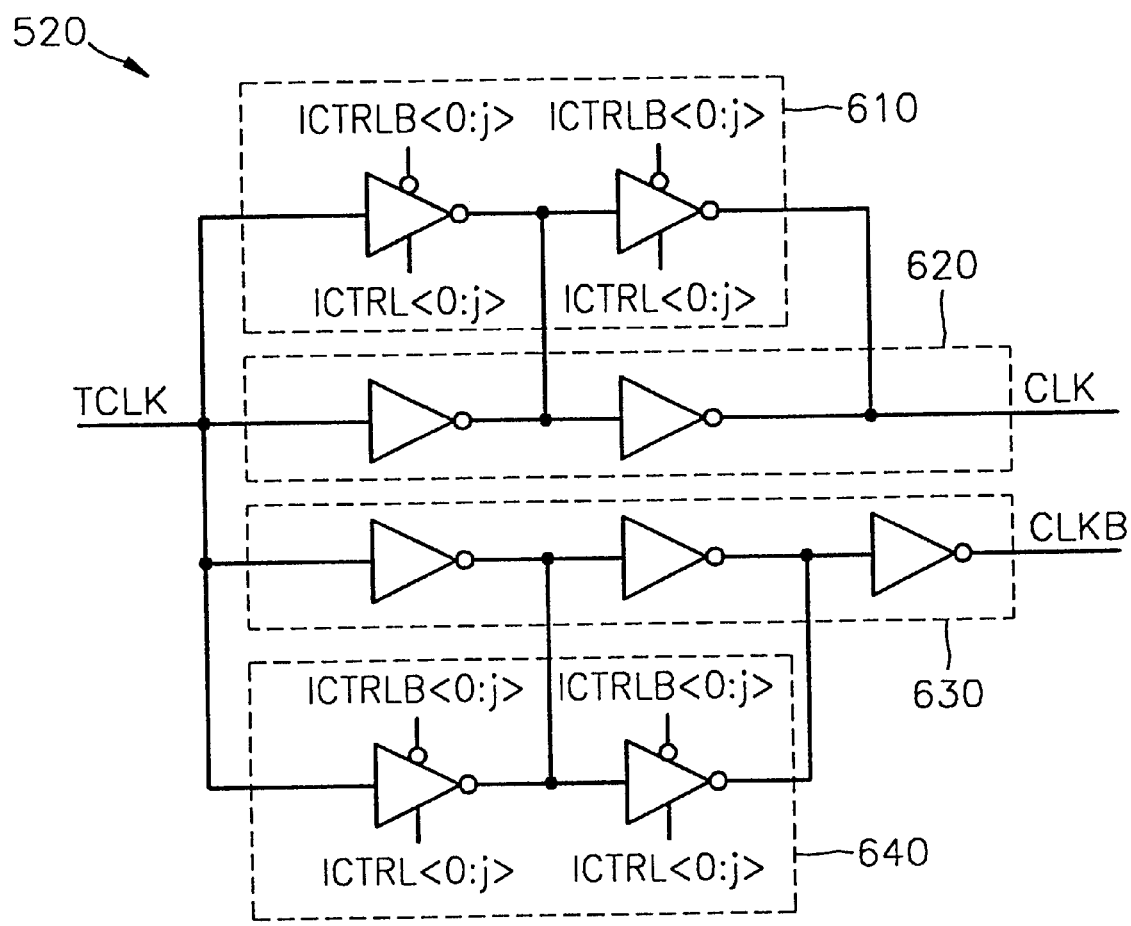
FIG. 5 shows the internal clock signal compensating unit of FIG. 4.

In FIG. 5, the internal clock signal compensating unit 520 includes first and second inverter chains 610 and 620, which buffer the internal clock signal TCLK to generate a complementary clock signal CLK. The internal clock signal compensating unit 520 further includes third and fourth inverter chains 630 and 640, which invert the internal clock signal TCLK to generate an inverted complementary clock signal CLKB. The first inverter chain 610 including inverters selectively enabled by the pair of control clock signals ICTRL<0:j> and ICTRLB<0:j>, delays the internal clock signal TCLK by a predetermined time to generate the complementary clock signal CLK. The fourth inverter chain 640 including inverters selectively enabled by the pair of control clock signals ICTRL<0:j> and ICTRLB<0:j>, delays the internal clock signal TCLK by a predetermined time.

Figure 6:
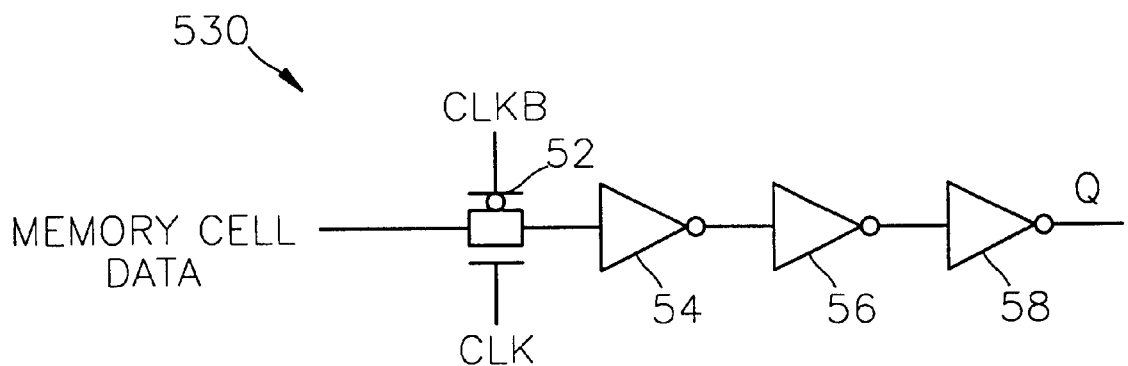
FIG. 6 shows the data transmitter of FIG. 4.

FIG. 6 shows the data transmitter 530 of FIG. 4. Referring to FIG. 6, the data transmitter 530 transmits the memory cell data as an output signal Q of the output multiplexer 440, via a transmission gate 52 and responsive through inverters 54, 56 and 58, in response to the pair of complementary clock signals CLK and CLKB.

Turning to FIG. 3, the output driver 450 includes a first group of transistors 451 and a second group of transistors 452. The first group of transistors 451 includes a plurality of transistors 451a, 451b, 451c, 451d, and 451e, each transistor having a gate to which the current control signals ICTRL<0:i> are connected and having a different width. The widths of the transistors 451a, 451b, 451c, 451d, and 451e are represented by a multiplication relationship indicated by the symbol X. For example, the transistor 451b has twice the width of the transistor 451a.

The second group of transistors 452 includes a plurality of transistors 452a, 452b, 452c, 452d, and 452e, each transistor having a gate to which the output signal Q of the output multiplexer 440 is connected, a drain to which the source of a corresponding transistor of the first group of transistors 451 is connected, and a source to which a ground voltage VSS is connected. The transistors 452a, 452b, 452c, 452d, and 452e are depletion transistors.

The transistors 451a, 451b, 451c, 451d, and 451e of the first group of transistors 451 and the transistors 452a, 452b, 452c, 452d, and 452e of the second group of transistors 452, are connected to form current paths along which current flows into the ground voltage VSS. If current flows through one or more current paths, then the voltage level of the data terminal DQ is lowered. As a result, the data transition time of the data terminal DQ is shortened to improve the switching speed.

Figure 7:
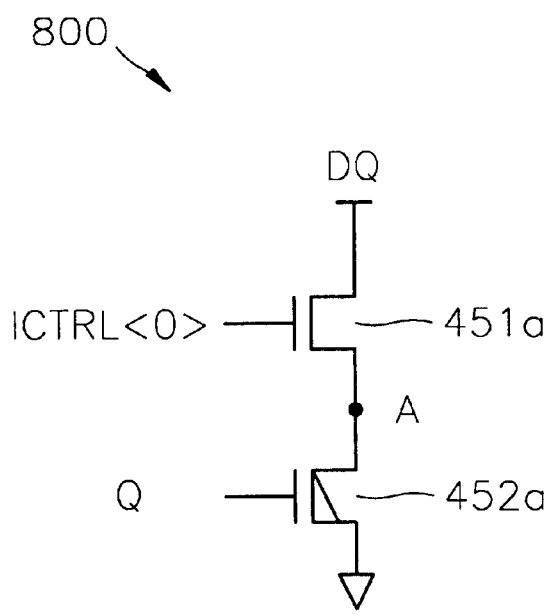
FIG. 7 shows an example of the output driver of FIG. 3.

The operation of an output driver 800 of FIG. 7 will now be described using a current path formed of one transistor 451a of the first group of transistors 451 and one transistor 452a of the second group of transistors 452. The operation of first and second transistors 451a and 452a responsive to the current control signal ICTRL<0> and the output signal Q of the output multiplexer 440, will be described in conjunction with FIGS. 8 and 9.

Figure 8:
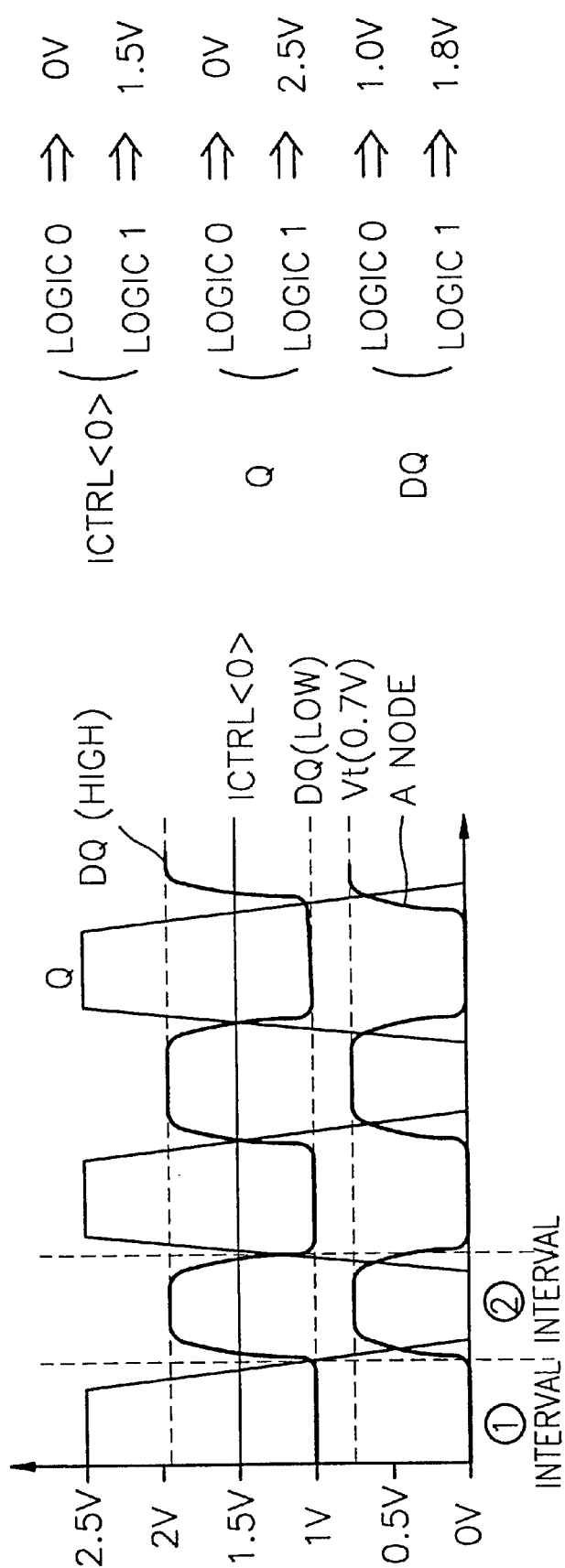
FIG. 8 shows operation waveforms of the output driver of FIG. 7 when a current control signal is at a logic high level.

FIG. 8 shows the output waveform of the data terminal DQ relative to the output signal Q of the output multiplexer 440, when the current control signal ICTRL<0> is 1.5 V, which is a logic high level. An interval $\hat{1}$ shows the case in which the output signal Q of the output multiplexer is at a logic high level, which is 2.5 V. During the interval ①, the second transistor 452a is turned on in response to the output signal Q of 2.5 V, so that node A becomes 0 V. Furthermore, the first transistor 451a is turned on by the current control signal ICTRL<0> of 1.5 V. Thus, current flows through the first and second transistors 451a and 452a. The data terminal DQ is at a voltage level of about 1 V, which is externally recognized as a logic low level.

An interval $\hat{2}$ in FIG. 8 shows the case in which the output signal Q of the output multiplexer is at a logic low level, which is 0 V. The first transistor 451a is already in a turned-on state by the current control signal ICTRL<0> of 1.5 V, and the second transistor 452a is also in a turned-on state by the output signal Q of the output multiplexer. This is because the second transistor is a depletion transistor. In this case however, the current flowing through the second transistor 452a is small compared to the interval $\hat{1}$. Thus, the node A has a threshold voltage level of a transistor, which is 0.7 V. A small amount of current thus flows through the first and second transistors 451a and 452a, so that the data terminal DQ is at a voltage level of about 1.8 V. This is externally recognized as a logic high level.

Figure 9:
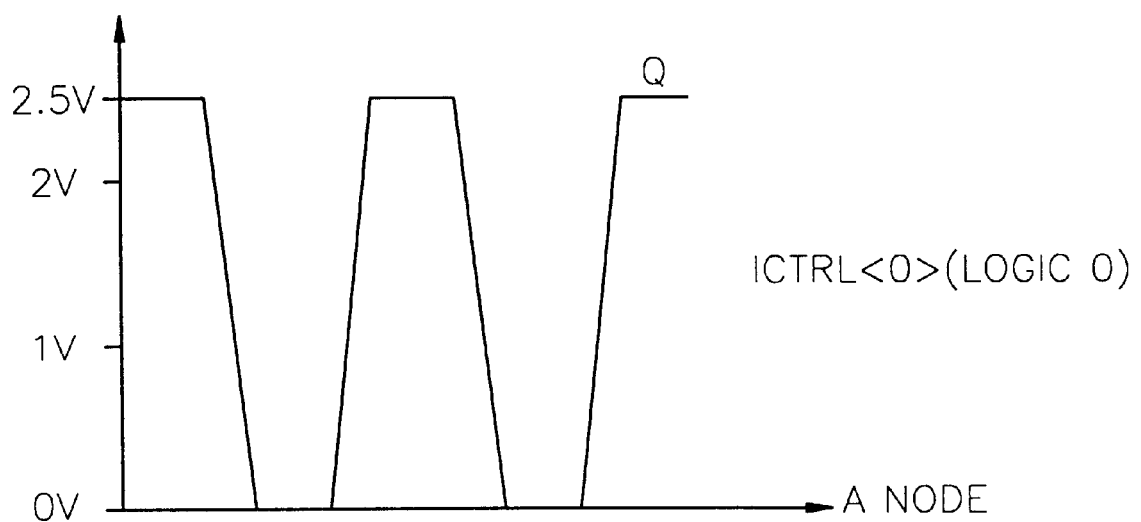
FIG. 9 shows operation waveforms of the output driver of FIG. 7 when a current control signal is at a logic low level.

FIG. 9 shows the output waveform of the data terminal DQ with respect to the output signal Q of the output multiplexer when the current control signal ICTRL<0> is at a logic low level, which is 0 V. Referring to FIG. 9, the first transistor 451a is turned off by the current control signal ICTRL<0>, which is 0 V. Thus, the power supply to the node A is cut off, so the node A becomes 0 V. In this case, the data terminal is at a logic high level, which is a termination voltage Vterm (not shown) level applied to a termination resistor Rterm (not shown) connected thereto.

Thus, the semiconductor memory device (400 of FIG. 4) according to this embodiment allows the output multiplexer 440 to adjust the propagation time of the output signal Q by the current control signals ICTRL<0:i>, depending on the switching time of the data terminal DQ determined by the current control signals ICTRL<0:i> in the output driver 450. Thus, a margin of the data setup time and data hold time of the data terminal DQ can be secured.

Figure 10:
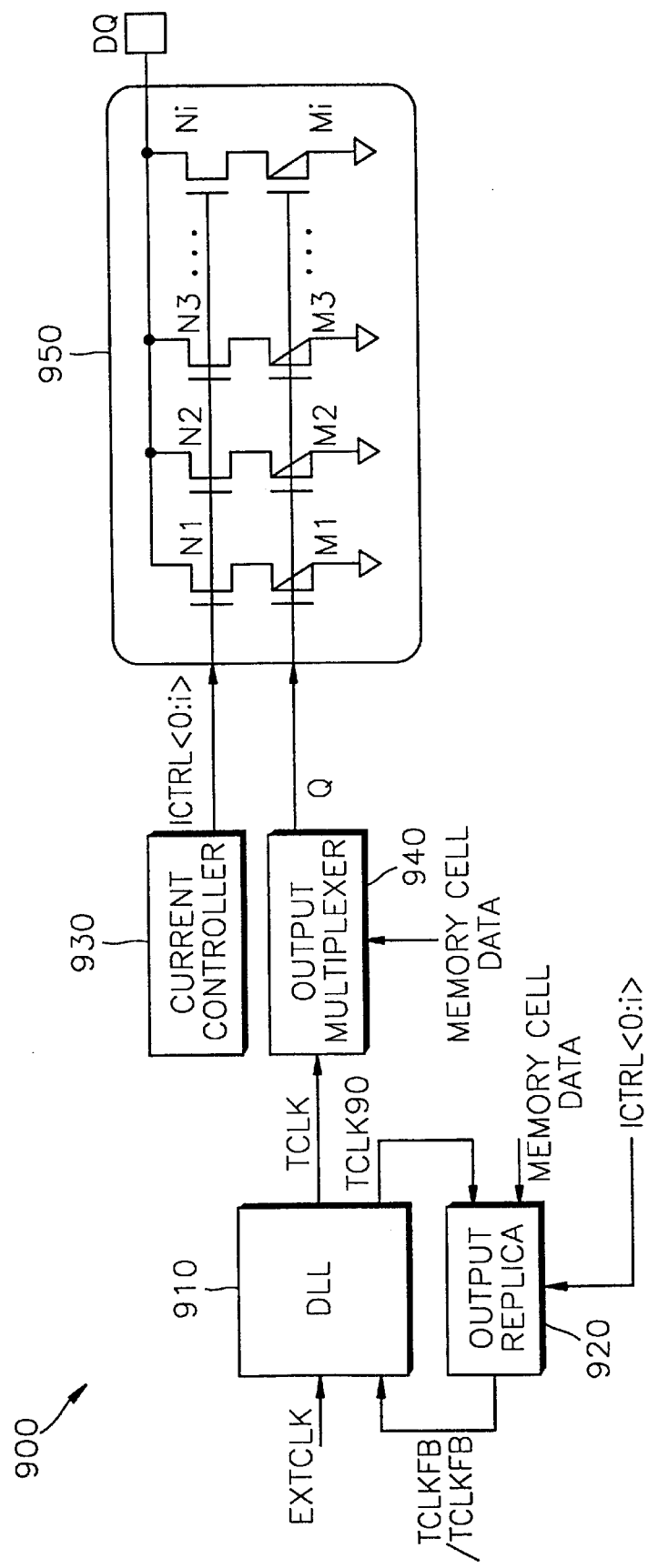
FIG. 10 shows a semiconductor memory device according to a second embodiment of the present invention.

FIG. 10 shows a semiconductor memory device 900 according to a second embodiment of the present invention. Like the semiconductor memory device 100 of FIG. 1, the semiconductor memory device 900 includes a delay locked loop (DLL) 910, an output replica 920, a current controller 930, an output multiplexer 940, and an output driver 950. The difference is that the output replica 920 in FIG. 10 is controlled by current control signals ICTRL<0:i>, unlike the output replica 120 of FIG. 1. To avoid the redundancy of description, a detailed description of the same elements are omitted.

Figure 2:
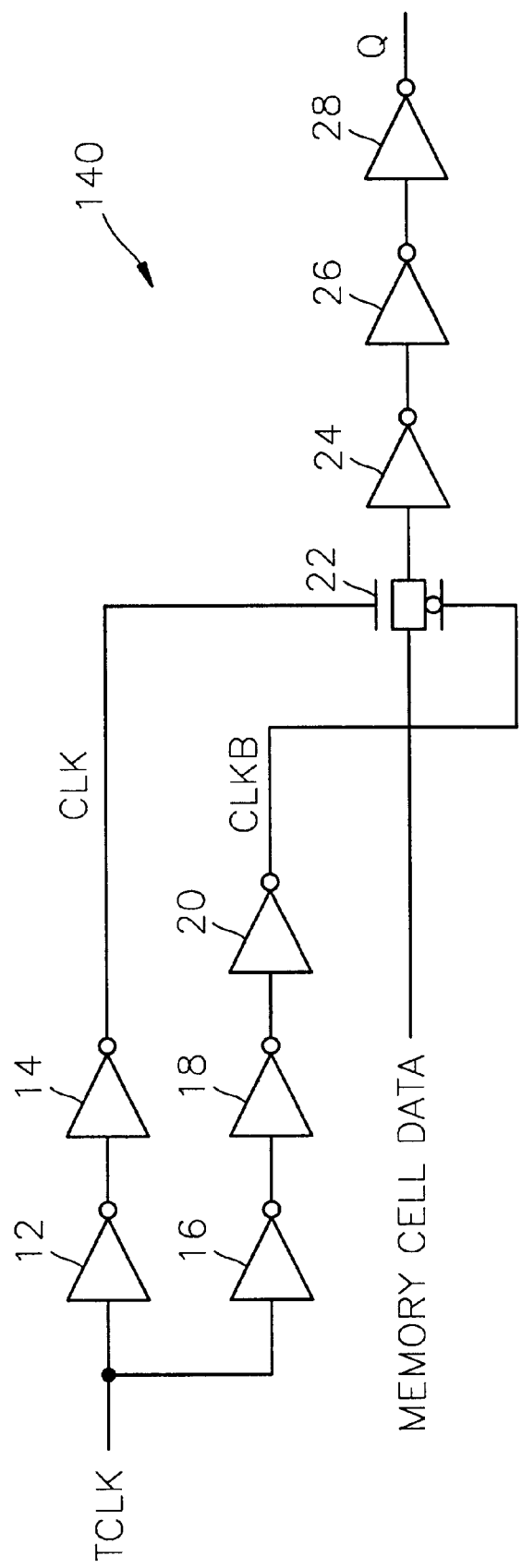
FIG. 2 shows the output multiplexer of FIG. 1.
Figure 11:
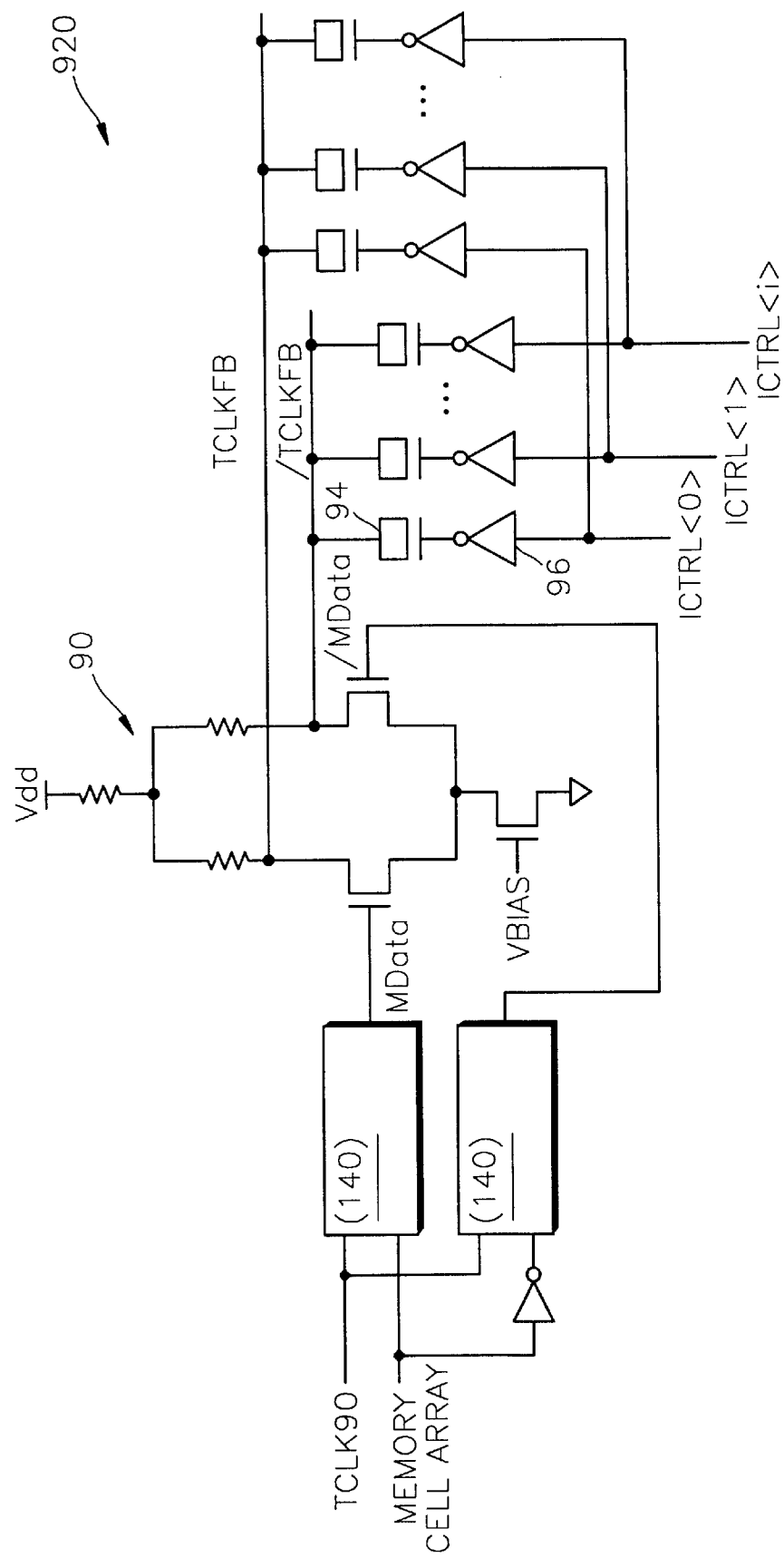
FIG. 11 shows a portion of the output replica of FIG. 10.

FIG. 11 shows a detailed circuit diagram showing a portion of the output replica 920. Referring to FIG. 11, two output multiplexers 140, which are equivalent in structure and function to the output multiplexer of FIG. 2, are respectively directly coupled and coupled via an inverter, to a memory cell array. The output multiplexers 140 provide memory cell data MData and inverted memory cell data /Mdata and are controlled by internal delay clock signal TCLK90. Memory cell data MDATA and /MDATA are input as input signals to a typical differential amplifier 90. The output signals of the differential amplifier 90 are a pair of feedback clock signals TCLKFB and /TCLKFB. Each feedback clock signal line is coupled to respective inverters 96 via respective capacitors 94, whereby the current control signals ICTRL<0:i> are respectively input to the inverters 96.

When the current control signals ICTRL<0:i> are selectively at a logic high level, the outputs of the inverters 96 connected thereto are at a logic low level. This enables nodes on one side of the corresponding capacitors 94 to be at a VSS level, to increase the line capacitance of the feedback clock signals TCLKFB and /TCLKFB. As the number of the current control signals ICTRL<0:i> having a logic high level increases, the slope of the pair of feedback clock signals TCLKFB and /TCLKFB, that is, a data transition time, becomes longer.

Thus, the semiconductor memory device 900 allows the output replica 920 to to adjust the transition time of the pair of feedback clock signals TCLKFB and /TCLKFB by the current control signals ICTRL<0:i>, depending on the switching time of the data terminal DQ determined by the current control signals ICTRL<0:i> in the output driver 950. An internal clock signal TCLK output from the DLL 910, to which the feedback clock signal TCLKFB and an external clock signal EXTCLK are input, is also compensated for the current control signals ICTRL<0:i>. That is, the output replica 920 serves to compensate for the data setup time and data hold time changed by the current control signals ICTRL<0:i> in the output driver 950.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor memory device in which memory cell data is output to a data terminal in synchronization with an internal clock signal phase locked with an external clock signal, the semiconductor memory device comprising:

an output multiplexer that delays the memory cell data by a time responsive to current control signals for regulating current of the data terminal, and that outputs delayed memory cell data; and an output driver that is driven by the current control signals and the delayed memory cell data, to determine voltage level of the data terminal.

2. The semiconductor memory device of claim 1, wherein the current control signals are selectively activated depending on variations in process, temperature, and power supply.

3. The semiconductor memory device of claim 1, wherein the output driver comprises:

a first group of transistors having gates respectively coupled to the current control signals, and having drains coupled to the data terminal; and a second group of transistors having gates coupled to the delayed memory cell data, drains respectively coupled to sources of the first group of transistors, and sources coupled to a ground voltage.

4. The semiconductor memory device of claim 3, wherein the second group of transistors comprises depletion transistors.

5. The semiconductor memory device of claim 1, wherein the output multiplexer comprises:

an analog-to-digital converter/driver that converts the current control signals into digital control clock signals;

an internal clock signal compensating unit that delays the internal clock signal to generate complementary clock signals, responsive to the digital control clock signals; and a data transmitter that outputs the delayed memory cell data, responsive to the complementary clock signals.

6. The semiconductor memory device of claim 5, wherein the internal clock signal compensating unit comprises:

a first inverter chain that delays the internal clock signal by a time to generate a first complementary clock signal, responsive to the digital control clock signals;

a second inverter chain that buffers the internal clock signal to also generate the first complementary clock signal;

a third inverter chain that inverts the internal clock signal to generate an inverted second complementary clock signal; and a fourth inverter chain that delays the internal clock signal by a time to provide a delayed internal clock signal to the third inverter chain, responsive to the digital control clock signals.

7. A semiconductor memory device in which memory cell data is output to a data terminal in synchronization with an internal clock signal phase locked with an external clock signal, the semiconductor memory device comprising:

a delay locked loop that receives the external clock signal and a feedback clock signal, compares a phase of the external clock signal with a phase of the feedback clock signal, and generates the internal clock signal and an internal delay clock signal;

an output replica that delays the internal delay clock signal by a phase to generate the feedback clock signal;

an output multiplexer that delays the memory cell data by a time and that outputs the delayed memory cell data in synchronization with the internal clock signal and responsive to current control signals for regulating current of the data terminal; and an output driver that is driven by the current control signals and the delayed memory cell data, to determine voltage level of the data terminal.

8. The semiconductor memory device of claim 7, wherein the output multiplexer comprises:

an analog-to-digital converter/driver that converts the current control signals into digital control clock signals;

an internal clock signal compensating unit that delays the internal clock signal by a time to generate complementary clock signals, responsive to the digital control clock signals; and a data transmitter that outputs the delayed memory cell data, responsive to the complementary clock signals.

9. The semiconductor memory device of claim 8, wherein the internal clock signal compensating unit comprises:

a first inverter chain that delays the internal clock signal by a time to generate a first complementary clock signal, responsive to the digital control clock signals;

a second inverter chain that buffers the internal clock signal to also generate the first complementary clock signal;

a third inverter chain that inverts the internal clock signal to generate an inverted second complementary clock signal; and a fourth inverter chain that delays the internal clock signal by a time to provide a delayed internal clock signal to the third inverter chain, responsive to the digital control clock signals.

10. A semiconductor memory device in which memory cell data is output to a data terminal in synchronization with an internal clock signal phase locked with an external clock signal, the semiconductor memory device comprising:

an output multiplexer that controls phase of the internal clock signal responsive to current control signals for regulating current of the data terminal and that outputs the memory cell data based on the controlled internal clock signal; and an output driver that is driven by the current control signals and the memory cell data from the output multiplexer, to determine voltage level of the data terminal.

11. The semiconductor memory device of claim 10, wherein the current control signals are selectively activated depending on variations in process, temperature, and power supply.

12. The semiconductor memory device of claim 10, wherein the output driver comprises:

a first group of transistors having gates respectively coupled to the current control signals, and drains coupled to the data terminal; and a second group of transistors having gates coupled to the memory cell data provided by the output multiplexer, drains respectively coupled to sources of the first group of transistors, and sources coupled to a ground voltage.

13. The semiconductor memory device of claim 10, wherein the second group of transistors are depletion transistors.

14. A semiconductor memory device in which memory cell data is output to a data terminal in synchronization with an internal clock signal phase locked with an external clock signal, the semiconductor memory device comprising:

a delay locked loop that receives the external clock signal and a feedback clock signal, compares a phase of the external clock signal with a phase of the feedback clock signal, and generates the internal clock signal and an internal delay clock signal;

an output replica that generates the feedback clock signal and controls a load of a line of the feedback clock signal, responsive to current control signals for controlling current of the data terminal and the memory cell data;

an output multiplexer that outputs the memory cell data in synchronization with the internal clock signal; and an output driver that is driven by the current control signals and the memory cell data to determine voltage level of the data terminal.

15. The semiconductor memory device of claim 14, wherein the output replica comprises:

a differential amplifier having the memory cell data and inverted memory cell data input thereto and that generates an output signal and an inverted output signal;

a plurality of capacitors having first terminals which are respectively connected to the output signal and the inverted output signal; and a plurality of inverters having the current control signals input thereto and having outputs connected to second terminals of the capacitors.

16. A semiconductor memory device in which memory cell data is output to a data terminal in synchronization with an internal clock signal phase locked with an external clock signal, the semiconductor memory device comprising:

a delay locked loop that receives the external clock signal and a feedback clock signal, compares a phase of the external clock signal with a phase of the feedback clock signal, and generates the internal clock signal and an internal delay clock signal;

an output replica that generates the feedback clock signal and controls a load of a line of the feedback clock signal, responsive to current control signals for controlling current of the data terminal and the memory cell data;

an output multiplexer that delays the memory cell data by a time in synchronization with the internal clock signal; and an output driver that is driven by the current control signals and the delayed memory cell data to determine voltage level of the data terminal.

17. The semiconductor memory device of claim 16, wherein the output replica comprises:

a differential amplifier having the memory cell data and inverted memory cell data input thereto and that generates an output signal and an inverted output signal;

a plurality of capacitors having first terminals which are respectively connected to the output signal and the inverted output signal; and a plurality of inverters having the current control signals input thereto and having outputs connected to second terminals of the capacitors.

* * * * *